US011404571B2

(12) United States Patent
Carlson et al.

(10) Patent No.: US 11,404,571 B2
(45) Date of Patent: Aug. 2, 2022

(54) METHODS OF FORMING NAND MEMORY ARRAYS

(71) Applicant: Micron Technology, Inc., Boise, ID (US)

(72) Inventors: Chris M. Carlson, Nampa, ID (US); Hung-Wei Liu, Meridian, ID (US); Jie Li, Boise, ID (US); Dimitrios Pavlopoulos, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 16 days.

(21) Appl. No.: 17/083,190

(22) Filed: Oct. 28, 2020

(65) Prior Publication Data

US 2021/0074856 A1 Mar. 11, 2021

Related U.S. Application Data

(62) Division of application No. 16/412,710, filed on May 15, 2019, now Pat. No. 10,854,747, which is a division of application No. 15/645,202, filed on Jul. 10, 2017, now Pat. No. 10,446,681.

(51) Int. Cl.
*H01L 29/78* (2006.01)
*H01L 29/16* (2006.01)
(Continued)

(52) U.S. Cl.
CPC ...... *H01L 29/7843* (2013.01); *H01L 21/0217* (2013.01); *H01L 21/02247* (2013.01);
(Continued)

(58) Field of Classification Search
CPC ......... H01L 27/11524; H01L 27/11556; H01L 27/1157; H01L 27/11582; H01L 29/7843;
(Continued)

(56) References Cited

U.S. PATENT DOCUMENTS 5,065,222 A   11/1991 Ishii
5,990,516 A   11/1999 Momose et al.
(Continued)

FOREIGN PATENT DOCUMENTS

CN   CM 101521205   9/2009
EP   2423963   2/2012
(Continued)

OTHER PUBLICATIONS

Bedia et al., "Influence of the Thickness on Optical Properties of Sprayed ZnO Hole-Blocking Layers Dedicated to Inverted Organic Solar Cells", Energy Procedia 50, 2014, United Kingdom, pp. 603-609.

(Continued)

*Primary Examiner* — Galina G Yushina
(74) *Attorney, Agent, or Firm* — Wells St. John P.S.

(57) ABSTRACT

Some embodiments include device having a gate spaced from semiconductor channel material by a dielectric region, and having nitrogen-containing material directly against the semiconductor channel material and on an opposing side of the semiconductor channel material from the dielectric region. Some embodiments include a device having a gate spaced from semiconductor channel material by a dielectric region, and having nitrogen within at least some of the semiconductor channel material. Some embodiments include a NAND memory array which includes a vertical stack of alternating insulative levels and wordline levels. Channel material extends vertically along the stack. Charge-storage material is between the channel material and the wordline levels. Dielectric material is between the channel material and the charge-storage material. Nitrogen is within the channel material. Some embodiments include methods of forming NAND memory arrays.

12 Claims, 9 Drawing Sheets

(51) Int. Cl.

| | |
|---|---|
| *H01L 29/20* | (2006.01) |
| *H01L 27/11524* | (2017.01) |
| *H01L 27/11556* | (2017.01) |
| *H01L 27/1157* | (2017.01) |
| *H01L 27/11582* | (2017.01) |
| *H01L 21/02* | (2006.01) |
| *H01L 29/792* | (2006.01) |
| *H01L 29/10* | (2006.01) |
| *H01L 21/321* | (2006.01) |
| *H01L 29/788* | (2006.01) |

(52) U.S. Cl.
CPC .. *H01L 21/02252* (2013.01); *H01L 21/02271* (2013.01); *H01L 27/1157* (2013.01); *H01L 27/11524* (2013.01); *H01L 27/11556* (2013.01); *H01L 27/11582* (2013.01); *H01L 29/1054* (2013.01); *H01L 29/16* (2013.01); *H01L 29/20* (2013.01); *H01L 29/2003* (2013.01); *H01L 29/7883* (2013.01); *H01L 29/7889* (2013.01); *H01L 29/792* (2013.01); *H01L 29/7926* (2013.01); *H01L 21/3211* (2013.01)

(58) Field of Classification Search
CPC ..... H01L 29/1054; H01L 29/16; H01L 29/20; H01L 29/2003; H01L 29/7883; H01L 29/7889; H01L 29/792; H01L 29/7926; H01L 21/0217; H01L 21/02247; H01L 21/02252; H01L 21/02271; H01L 21/3211
See application file for complete search history.

(56) References Cited

U.S. PATENT DOCUMENTS

| | | | |
|---|---|---|---|
| 7,668,010 | B2 | 2/2010 | Ku et al. |
| 7,889,556 | B2 | 2/2011 | Ku et al. |
| 7,923,364 | B2 | 4/2011 | Goda |
| 8,441,855 | B2 | 5/2013 | Liu |
| 8,681,555 | B2 | 3/2014 | Liu |
| 8,792,280 | B2 | 7/2014 | Liu |
| 8,987,091 | B2 | 3/2015 | Then et al. |
| 9,036,421 | B2 | 5/2015 | Liu |
| 9,070,481 | B1 | 6/2015 | Ellis |
| 9,171,948 | B2 | 10/2015 | Mori |
| 9,209,290 | B2 | 12/2015 | Then et al. |
| 9,230,984 | B1 | 1/2016 | Takeguchi |
| 9,245,957 | B2 | 1/2016 | Kim et al. |
| 9,257,552 | B2 | 2/2016 | Mizushima |
| 9,306,027 | B2 | 4/2016 | Inoue et al. |
| 9,343,534 | B2 | 5/2016 | Kim et al. |
| 9,478,558 | B2 | 10/2016 | Koka et al. |
| 9,530,878 | B2 | 12/2016 | Then et al. |
| 9,741,737 | B1 | 8/2017 | Huang et al. |
| 9,755,062 | B2 | 9/2017 | Then et al. |
| 9,985,098 | B2 | 5/2018 | Matsumoto et al. |
| 10,014,311 | B2 | 7/2018 | Pavlopoulos et al. |
| 10,192,878 | B1 | 1/2019 | Tsutsumi et al. |
| 10,297,611 | B1 | 5/2019 | Wells et al. |
| 10,446,681 | B2 | 10/2019 | Carlson et al. |
| 10,559,466 | B2 | 2/2020 | Wells et al. |
| 2002/0055016 | A1 | 5/2002 | Hiramoto et al. |
| 2004/0001140 | A1 | 1/2004 | Murayama |
| 2004/0087093 | A1 | 5/2004 | Fukuda et al. |
| 2005/0176219 | A1 | 8/2005 | Kim et al. |
| 2006/0252281 | A1 | 11/2006 | Park et al. |
| 2006/0289953 | A1 | 12/2006 | Sakuma et al. |
| 2007/0082433 | A1 | 4/2007 | Yang et al. |
| 2007/0218663 | A1 | 9/2007 | Hao et al. |
| 2008/0150003 | A1 | 6/2008 | Chen et al. |
| 2009/0061613 | A1 | 3/2009 | Choi et al. |
| 2009/0213656 | A1 | 8/2009 | Ku et al. |
| 2009/0309171 | A1 | 12/2009 | Schrank |
| 2010/0012949 | A1 | 1/2010 | Soukiassian |
| 2010/0140709 | A1 | 6/2010 | Mouli |
| 2010/0148171 | A1* | 6/2010 | Hayashi ............ H01L 29/78648 257/E29.1 |
| 2010/0301340 | A1 | 12/2010 | Shih et al. |
| 2011/0003467 | A1 | 1/2011 | Kanda |
| 2011/0210353 | A1 | 9/2011 | Ren |
| 2012/0049145 | A1 | 3/2012 | Lee et al. |
| 2012/0063198 | A1 | 3/2012 | Liu |
| 2012/0132904 | A1 | 5/2012 | Yamazaki |
| 2012/0286349 | A1 | 11/2012 | Tan |
| 2012/0309144 | A1 | 12/2012 | Do et al. |
| 2013/0248977 | A1 | 9/2013 | Mori et al. |
| 2013/0270631 | A1* | 10/2013 | Kim ................ H01L 27/11582 257/331 |
| 2013/0271208 | A1 | 10/2013 | Then et al. |
| 2013/0309808 | A1* | 11/2013 | Zhang .............. H01L 29/66742 438/104 |
| 2014/0027764 | A1* | 1/2014 | Yamazaki ............ H01L 27/088 257/43 |
| 2014/0151690 | A1 | 6/2014 | Kim et al. |
| 2014/0152936 | A1 | 6/2014 | Kim et al. |
| 2014/0160850 | A1 | 6/2014 | Liu |
| 2014/0175530 | A1 | 6/2014 | Chien |
| 2015/0014813 | A1 | 1/2015 | Mueller et al. |
| 2015/0056797 | A1 | 2/2015 | Kim et al. |
| 2015/0060998 | A1 | 3/2015 | Mizushima |
| 2015/0162385 | A1* | 6/2015 | Dittmar ................ H01L 27/32 438/22 |
| 2015/0171205 | A1 | 6/2015 | Then et al. |
| 2015/0194478 | A1 | 7/2015 | Antonov et al. |
| 2015/0221774 | A1 | 8/2015 | Yamazaki et al. |
| 2015/0236038 | A1 | 8/2015 | Pachamuthu et al. |
| 2015/0249013 | A1 | 9/2015 | Arghavani et al. |
| 2016/0093631 | A1 | 3/2016 | Yun et al. |
| 2016/0111434 | A1 | 4/2016 | Pachamuthu et al. |
| 2016/0118396 | A1 | 4/2016 | Rabkin et al. |
| 2016/0189797 | A1 | 6/2016 | Yamamoto |
| 2016/0233328 | A1 | 8/2016 | Cheng |
| 2016/0268431 | A1 | 9/2016 | Moll et al. |
| 2016/0293621 | A1 | 10/2016 | Huang et al. |
| 2016/0343868 | A1 | 11/2016 | Koezuka et al. |
| 2016/0351576 | A1 | 12/2016 | Yamazaki et al. |
| 2016/0372327 | A1 | 12/2016 | Ventzek et al. |
| 2017/0005200 | A1 | 1/2017 | Sasaki |
| 2017/0012051 | A1* | 1/2017 | Lee ................ H01L 29/40117 |
| 2017/0077125 | A1 | 3/2017 | Yamasaki et al. |
| 2017/0110470 | A1 | 4/2017 | Rabkin et al. |
| 2017/0125536 | A1 | 5/2017 | Chen et al. |
| 2017/0168742 | A1 | 6/2017 | Nam et al. |
| 2017/0178923 | A1 | 6/2017 | Surla et al. |
| 2017/0330752 | A1 | 11/2017 | Kim et al. |
| 2018/0082892 | A1 | 3/2018 | Lee et al. |
| 2018/0122907 | A1 | 5/2018 | Choi et al. |
| 2018/0204849 | A1 | 7/2018 | Carlson et al. |
| 2019/0013404 | A1 | 1/2019 | Carlson et al. |
| 2019/0198320 | A1 | 6/2019 | Wells et al. |
| 2019/0280122 | A1 | 9/2019 | Carlson et al. |
| 2020/0006566 | A1 | 1/2020 | Chien et al. |
| 2021/0183876 | A1 | 6/2021 | Sun et al. |

FOREIGN PATENT DOCUMENTS

| | | | |
|---|---|---|---|
| EP | 18831466 | | 5/2020 |
| EP | 18894316 | | 11/2020 |
| JP | 62-298158 | | 12/1987 |
| JP | 63-174348 | | 7/1988 |
| JP | 04-010351 | | 1/1992 |
| JP | 04-109623 | | 4/1992 |
| JP | 06-288902 | | 10/1994 |
| JP | 2001-168305 | | 6/2001 |
| JP | 2012-004397 | | 1/2012 |
| JP | 2013-201270 | | 10/2013 |
| JP | 2013-222785 | | 10/2013 |
| JP | 2015-053336 | | 3/2015 |
| JP | 2879183 | * | 6/2015 ........... H01L 29/778 |
| JP | 2016-225614 | | 12/2016 |
| KR | 10-2013-0116116 | | 10/2013 |

(56) References Cited

FOREIGN PATENT DOCUMENTS

| TW | 201236112 | 9/2012 |
|---|---|---|
| TW | 201428980 | 7/2014 |
| TW | 201721921 | 6/2017 |
| TW | 201724269 | 7/2017 |
| TW | 107122930 | 2/2019 |
| TW | 107122930 | 6/2019 |
| WO | WO 2010/080318 | 7/2010 |
| WO | WO 2016/053623 | 4/2016 |
| WO | WO PCT/US2018/038826 | 11/2018 |
| WO | WO PCT/US2018/065437 | 4/2019 |
| WO | WO PCT/US2018/065462 | 4/2019 |
| WO | WO PCT/US2018/038826 | 1/2020 |
| WO | WO PCT/US2018/065437 | 6/2020 |
| WO | WO PCT/US2018/065462 | 6/2020 |

OTHER PUBLICATIONS

Dicks et al., "The Origin of Negative Charging in Amorphous Al2O3 Films: The Role of Native Defects", Nanotechnology 30, United Kingdom, 2019, 14 pages.

Diffusion, Lecture Notes No. 9, MIT Open Course, pp. 1-16.

Hyeon et al., "Electrical Characterization of Charge Polarity in AlF3 Anti-Reflection Layers for Complementary Metal Oxide Semiconductor Image Sensors", Journal of Nanoscience and Nanotechnology vol. 18, 2018, United States, pp. 6005-6009.

Kim, "Tunnel Oxide Nitridation Effect on the Evolution of Vt Instabilities (RTS/QED) and Defect Characterization for Sub-40-nm Flash Memory," IEEE Electron Device Letters, vol. 32 (8), Aug. 2011, pp. 999-1001.

Konig et al., "Field Effect of Fixed Negative Charges on Oxidized Silicon Induced by AlF3 Layers with Fluorine Deficiency", Applied Surface Science 234, 2004, Netherlands, pp. 222-227.

Kuhnhold-Pospischil et al., "Activation Energy of Negative Fixed Charges in Thermal ALD Al2O3", Applied Physics Letters 109, 2016, United States, 4 pages.

Morin et al., "A Comparison of the Mechanical Stability of Silicon Nitride Films Deposited with Various Techniques", Applied Surface Science vol. 260, 2012, Netherlands, pp. 69-72.

Gandhi et al., U.S. Appl. No. 17/182,737 titled "Transistors and Arrays of Elevationally-Extending Strings of Memory Cells", filed Feb. 23, 2021, 43 pages.

Gandhi et al., U.S. Appl. No. 17/182,808 titled "Transistors and Arrays of Elevationally-Extending Strings of Memory Cells", filed Feb. 23, 2021, 27 pages.

Hsiao et al., "A Critical Examination of 3D Stackable NAND Flash Memory Architectures by Simulation Study of the Scaling Capability", IEEE International Memory Workshop, 2010, United States, 4 pages.

\* cited by examiner

METHODS OF FORMING NAND MEMORY ARRAYS

RELATED PATENT DATA

This patent resulted from a divisional of U.S. patent application Ser. No. 16/412,710 which was filed May 15, 2019, which is a divisional of U.S. patent application Ser. No. 15/645,202 which was filed Jul. 10, 2017, each of which is hereby incorporated by reference herein.

TECHNICAL FIELD

NAND memory arrays, devices comprising semiconductor channel material and nitrogen, and methods of forming NAND memory arrays.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND architecture may be a basic unit of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells. It is desired to develop improved NAND architecture.

Transistors are another common component of integrated circuitry. Example transistors are flash transistors. Such may be utilized in, for example, memory, sensors, etc. It is desired to develop improved transistor architectures.

DETAILED DESCRIPTION OF THE ILLUSTRATED EMBODIMENTS

Semiconductor components may comprise semiconductor channel material. For instance, NAND may be configured to have semiconductor channel material extending along a string of NAND memory cells. As another example, flash transistors are typically configured to have semiconductor channel material between a pair of source drain regions. The channel material will have suitable conductivity for transport of electrons during operation of a device (e.g., during string operations of NAND memory, during electrical flow between the source/drain regions of a flash transistor, etc.). The semiconductor channel material may comprise any of numerous semiconductor materials; including, for example, silicon, germanium, III/V materials (e.g., GaAs, InP, GaP and GaN), etc. In some aspects, it is found that diffusion of nitrogen into semiconductor channel material, and/or formation of silicon nitride directly against the channel material, can improve conductivity of the channel material. The mechanism for such improvement may be through modification of grain boundaries within the channel material and/or through other physical/chemical enhancements to the channel material. The possible mechanism is provided to assist the reader in understanding aspects of the invention described herein, and is not to limit the invention except to the extent, if any, that such mechanism is expressly recited in the claims that follow. Example embodiments are described with reference to FIGS. 1-13.

Figure 1:
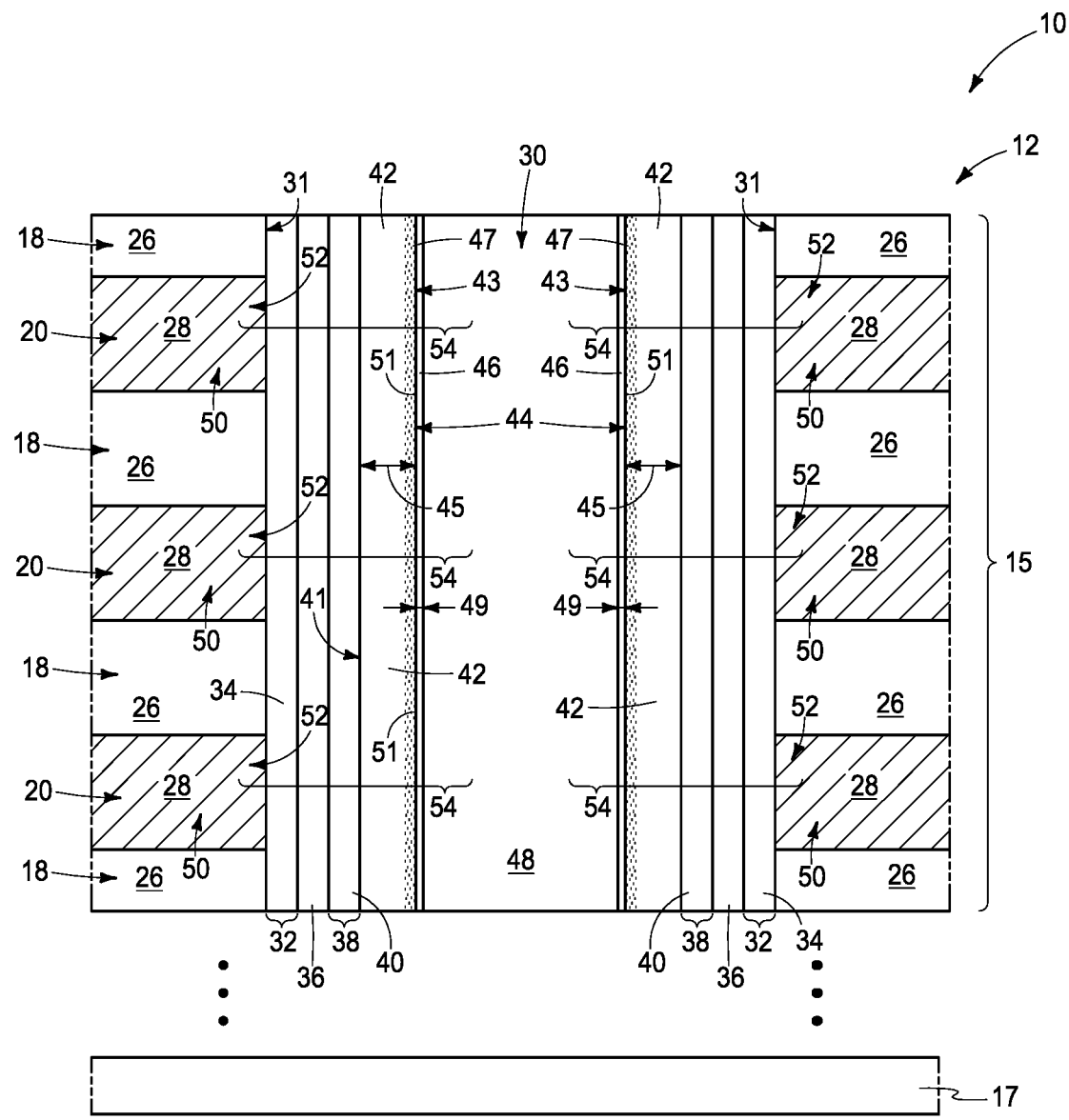
FIGS. 1 and 1A are a diagrammatic cross-sectional side view, and diagrammatic top view, respectively of an example portion of an example NAND memory array.
Figure 1A:
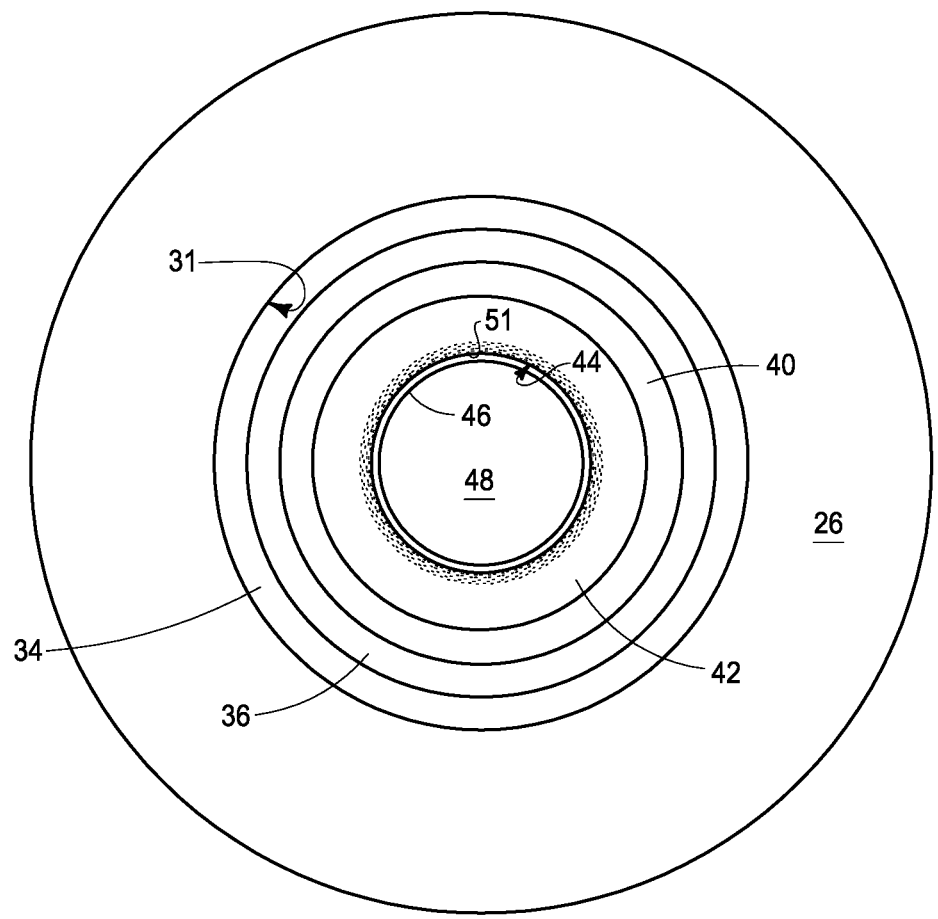

Referring to FIGS. 1 and 1A, a portion of an integrated structure 10 is illustrated, with such portion being a fragment of a three-dimensional NAND memory array 12.

The integrated structure 10 comprises a stack 15 of alternating first and second levels 18 and 20. The levels 18 are insulative (i.e., dielectric), and the levels 20 are conductive. The "levels" 18 and 20 may be alternatively referred to as "layers" 18 and 20.

The insulative levels 18 comprise insulative material 26. Such insulative material may comprise any suitable composition or combination of compositions; and may, for example, comprise silicon dioxide.

The conductive levels 20 comprise conductive material 28. The conductive material 28 may comprise any suitable composition or combination of compositions; and in some embodiments may comprise one or more of various metals (e.g., titanium, tungsten, cobalt, nickel, platinum, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive levels 20 and insulative levels 18 may be of any suitable vertical thicknesses. In some embodiments, the conductive levels 20 and the insulative levels 18 may have vertical thicknesses within a range of from about 10 nanometers (nm) to about 300 nm. In some embodiments, the conductive levels 20 may have about the same vertical thicknesses as the insulative levels 18. In other embodiments, the conductive levels 20 may have substantially different vertical thicknesses than the insulative levels 18.

The stack 15 is supported by a base 17. The base 17 may comprise semiconductor material; and may, for example, comprise, consist essentially of, or consist of monocrystalline silicon. The base 17 may be referred to as a semiconductor substrate. The term "semiconductor substrate" means any construction comprising semiconductive material, including, but not limited to, bulk semiconductive materials; such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 17 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 17 and the stack 15 to indicate that there may be other materials, components, etc., provided between the base 17 and the stack 15. For instance, a conductive source line (not shown) may be provided between the stack 15 and the base 17.

An opening 30 extends through the stack 15. The opening has sidewalls 31 that extend along the levels 18 and 20. Although the opening 30 appears to have two sidewalls in the cross-sectional view of FIG. 1, in actual practice the opening may have a closed shape when viewed from above (e.g., a circular shape, elliptical shape, polygonal shape, etc.), and accordingly there may be a continuous sidewall extending entirely around the opening 30 as shown in the top view of FIG. 1A.

A charge-blocking region 32 extends vertically along the sidewalls 31 of opening 30, with the charge-blocking region comprising charge-blocking material 34. The charge-blocking material 34 may comprise any suitable composition or combination of compositions; including, for example, silicon dioxide and one or more high-k dielectric materials, etc.

Charge-storage material 36 extends vertically along the charge-blocking material 34. The charge-storage material 36 may comprise any suitable composition or combination of compositions; and in some embodiments may comprise floating gate material (for instance, doped or undoped silicon) or charge-trapping material (for instance, silicon nitride, metal dots, etc.). In some embodiments, the charge-storage material 36 may comprise, consist essentially of, or consist of silicon nitride. In such embodiments, the charge-storage material 36 may have a thickness within a range of from about 50 Å to about 80 Å. The illustrated embodiment of FIG. 1 is representative of a configuration commonly associated with NAND having charge-trapping material utilized for charge-storage material 36. A configuration commonly associated with NAND utilizing floating gate material is described below with reference to FIG. 11.

A dielectric region 38 extends vertically along the charge-storage material 36. The dielectric region 38 comprises dielectric material 40. In some embodiments, the dielectric material 40 may be referred to as gate dielectric material, as tunneling material, or as charge-passage material. The dielectric material 40 may comprise any suitable composition or combination of compositions; and in some embodiments may comprise, consist essentially of, or consist of silicon dioxide. In some embodiments, the dielectric material 40 may be band-gap engineered to have desired charge tunneling properties; and in such embodiments may comprise silicon nitride sandwiched between a pair of silicon dioxide layers, and/or any other suitable configuration.

Channel material 42 extends vertically along the dielectric material 40. In some embodiments, the channel material 42 may be considered to form a hollow tube 44 extending vertically along the opening 30 through stack 15.

The channel material 42 may comprise any suitable composition or combination of compositions; and in some embodiments may comprise, consist essentially of, or consist of appropriately-doped semiconductor material. Such semiconductor material may include, for example, one or more of silicon, germanium and so-called III/V semiconductor materials (e.g., GaAs, InP, GaP and GaN). In some embodiments, the channel material 42 may comprise, consist essentially of, or consist of appropriately-doped polycrystalline silicon.

The tube 44 of channel material 42 has an exterior surface 41 along the dielectric material 40, an interior surface 43 in opposing relation to the exterior surface 41; and a wall thickness 45 between the interior surface 43 and the exterior surface 41. In some embodiments, such wall thickness may be within a range of from about 50 Å to about 150 Å.

Nitride is formed along the interior surface 43 of the channel material 42 and/or nitrogen is diffused into the channel material 42. In some embodiments, the nitride formed along the interior surface 43 of the channel material 42 may comprise, consist essentially of, or consist of silicon nitride. In the illustrated embodiment of FIG. 1, a thin layer (i.e., film) of silicon nitride 46 is formed along the interior surface 43 of the hollow tube 44 of channel material 42.

The silicon nitride 46 may be considered to be a layer having a wall thickness 49. Such wall thickness may be within a range of from about 5 Å to about 30 Å in some embodiments. The silicon nitride 46 may be referred to as stoichiometric silicon nitride in some embodiments to indicate that the silicon nitride has the stoichiometric composition corresponding to $Si_3N_4$.

Insulative material 48 is provided within the hollow tube 44. The insulative material 48 may comprise any suitable composition or combination of compositions; and in some embodiments may comprise, consist essentially of, or consist of silicon dioxide.

In some embodiments, the conductive levels 20 may be referred to as wordline levels of a NAND memory array. Terminal ends 50 of the wordline levels 20 may function as control gate regions 52 of NAND memory cells 54, with approximate locations of the memory cells 54 being indicated with brackets in FIG. 1.

The vertically-stacked memory cells 54 form a vertical string (such as, for example, a vertical NAND string of memory cells), with the number of memory cells in each string being determined by the number of conductive levels 20. The stack 15 may comprise any suitable number of conductive levels. For instance, the stack may have 8 conductive levels, 16 conductive levels, 32 conductive levels, 64 conductive levels, 512 conductive levels, 1028 conductive levels, etc.

The configuration of FIG. 1 may be considered to have memory cells 54 with gates 52 spaced from semiconductor channel material 42 by dielectric regions 32 and 38, and by charge-storage material 36. Nitrogen-containing material 46 is directly against the semiconductor channel material 42 and on an opposing side of the semiconductor channel material 42 from the dielectric regions 32/38 and the charge-storage material 36.

In some embodiments, nitrogen extends into the semiconductor channel material 42; with such nitrogen being diagrammatically illustrated with stippling in FIGS. 1 and 1A. The nitrogen may extend only partially into the semiconductor channel material 42 (as shown with the indicated stippling of FIGS. 1 and 1A), or may extend entirely through the semiconductor channel material 42. In some embodiments, the nitrogen may be primarily along an interface 51 where the semiconductor channel material 42 joins with the nitrogen-containing material 46. In operation, charge flows parallel to the interface 51 as the charge flows within the channel material 42 along the vertical string of memory cells 54. The nitrogen along the interface and/or within the channel material 42 is found to increase the conductivity of the channel region 42 which advantageously improves charge flow along the vertical string of memory cells.

In some embodiments, the nitrogen is present within a volume of the semiconductor channel material to a concentration within a range of from about 0.1 atomic percent to about 5 atomic percent. In some embodiments, the volume of the semiconductor channel material comprising the nitrogen may be within a range of from about one volume percent of the semiconductor channel material 42 to about an entirety of the semiconductor channel material 42; within a range of from about 1 volume percent of the semiconductor channel material 42 to about 50 volume percent of the semiconductor channel material 42; within a range of from about 1 volume percent of the semiconductor channel material 42 to about 25 volume percent of the semiconductor channel material 42; etc. In some embodiments, the volume of the semiconductor channel material comprising the nitrogen therein may be within a distance of no greater than about 10 Å from the interface 51; may be within a distance of no greater than about 30 Å from the interface 51; may be within a distance of no greater than about 50 Å from the interface 51; etc.

In some embodiments, one or more of oxygen, fluorine and hydrogen may be within the semiconductor channel material 42 in addition to the nitrogen. In such embodiments, the oxygen, fluorine and/or hydrogen may be contained within a same volume of the semiconductor channel material as the nitrogen. Alternatively, the nitrogen may extend into an additional volume of the semiconductor channel material which is not occupied by oxygen, fluorine and/or hydrogen; or the oxygen, fluorine and/or hydrogen may extend into an additional volume of the semiconductor channel material which is not occupied by the nitrogen. If oxygen, fluorine and/or hydrogen is present in the semiconductor channel material 42, such may be present to any suitable concentration. For instance, oxygen may be present to a concentration within a range of from about 0.1 atomic percent to about 10 atomic percent; fluorine may be present to a concentration within a range of from about 0.1 atomic percent to about 10 atomic percent; and hydrogen may be present to a concentration within a range of from about 0.1 atomic percent to about 40 atomic percent.

Figure 2:
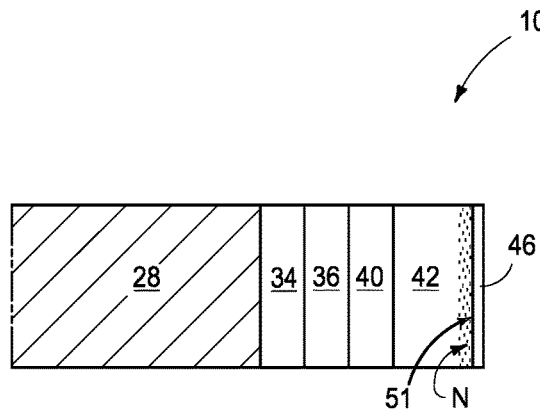
FIGS. 2 and 3 are regions of the NAND memory array of FIG. 1, showing example configurations.
Figure 3:
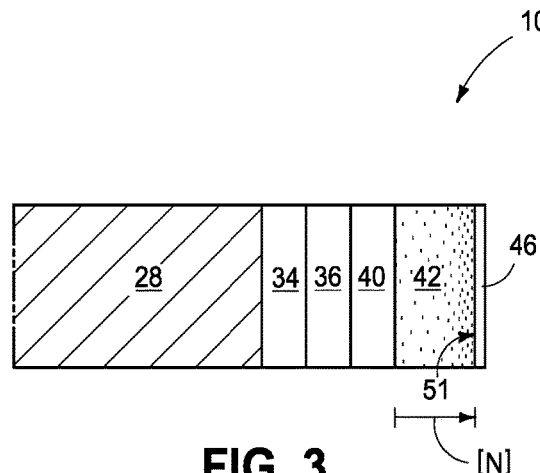

The nitrogen concentration within the semiconductor channel material 42 may be substantially constant throughout a volume of the channel material comprising the nitrogen, or may vary along a gradient. The term "substantially constant" means constant to within reasonable tolerances of fabrication and measurement. FIGS. 2 and 3 diagrammatically illustrate regions of construction 10, and show example distributions of nitrogen within the semiconductor channel material 42; and FIGS. 4-6 graphically illustrate the nitrogen concentration within locations of the construction 10.

Figure 4:
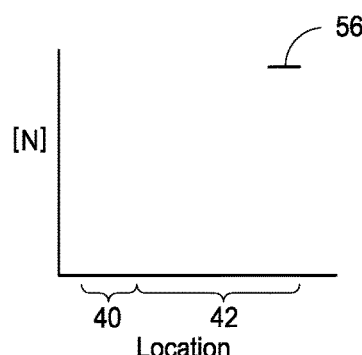
FIGS. 4-6 graphically illustrate the concentration of nitrogen across locations of a channel material in example configurations.

FIG. 2 shows an example in which the nitrogen is only along the interface 51 between the semiconductor channel material 42 and the nitrogen-containing material 46. An approximate location of the nitrogen is diagrammatically illustrated with stippling. FIG. 4 graphically illustrates the nitrogen concentration gradient as a line 56. The nitrogen is only within a portion of the channel material 42, and is present to a substantially constant amount across such portion of the channel material 42.

Figure 5:
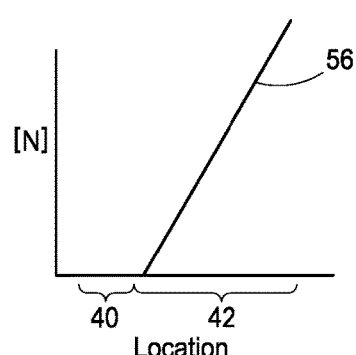
Figure 6:
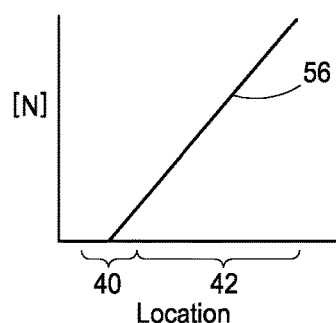

FIG. 3 shows an example in which the nitrogen extends across an entirety of the semiconductor channel material 42, and where the nitrogen concentration [N] increases in a direction toward the interface 51 (as represented by stippling within region 42, and by an arrow beneath region 42 indicating a concentration gradient of nitrogen). In some embodiments, the concentration of nitrogen within the channel material 42 may be considered to vary along a lateral direction, and to remain substantially constant along a vertical direction relative to the embodiment of FIG. 3. The nitrogen concentration within channel material 42 may vary along a gradient. An example gradient is illustrated in FIG. 5. The example gradient is a linear gradient decreasing across the entirety of the channel material 42. In other embodiments, the gradient may be a step gradient or any other suitable gradient. In some embodiments, the gradient may extend only partially across the channel material 42. In yet other embodiments, the gradient may extend beyond channel material 42 and partially or entirely through the tunnel dielectric material 40. FIG. 6 shows an example embodiment in which the election concentration gradient extends into the tunnel dielectric material 40.

The construction 10 of FIG. 1 may be formed with any suitable processing. Example processes are described with reference to FIGS. 7-10.

Figure 7:
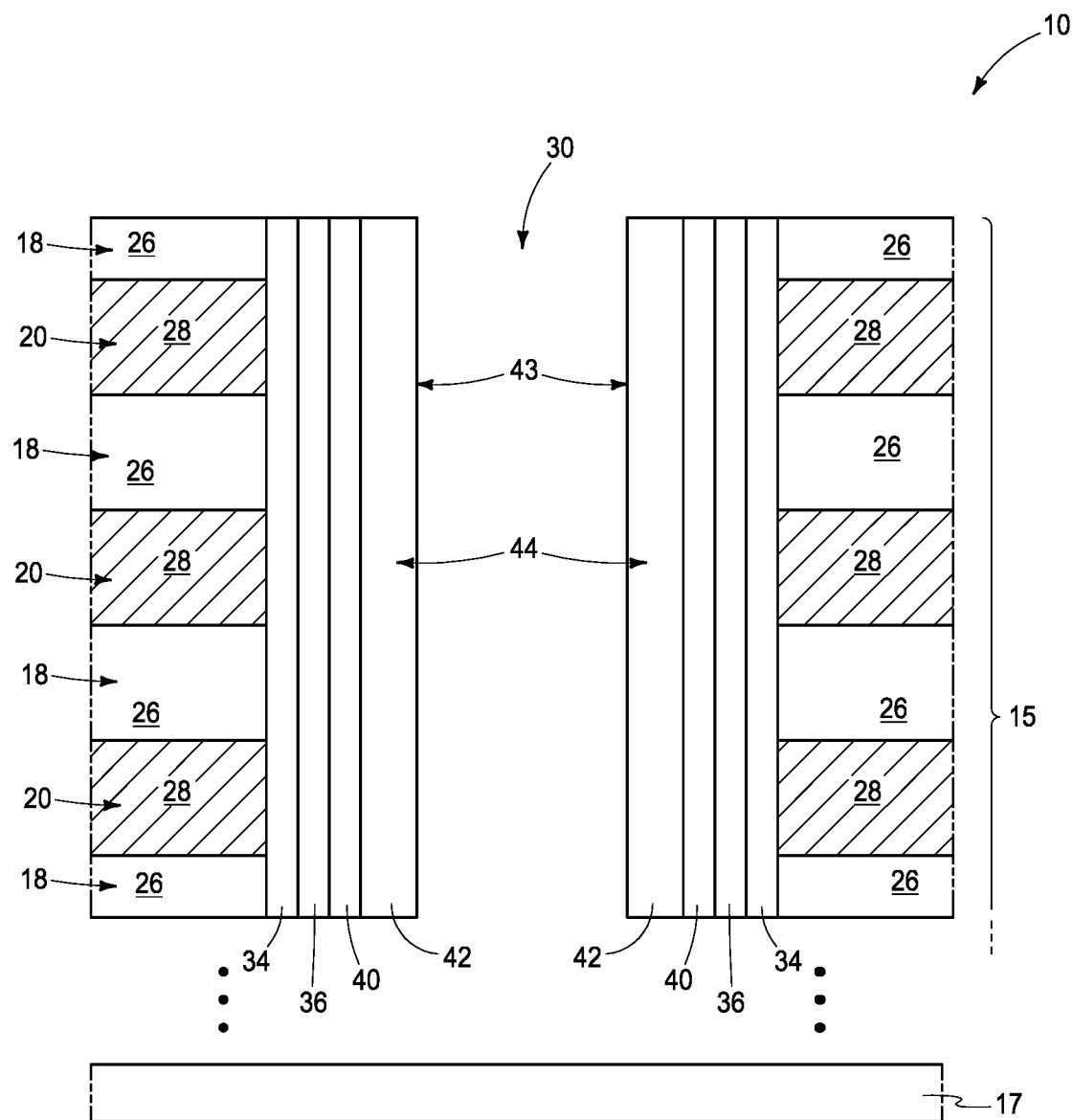
FIGS. 7-10 are diagrammatic cross-sectional side views of an assembly at various stages of an example process for forming an example NAND memory array.

Referring to FIG. 7, the construction 10 is illustrated at a processing stage after formation of an assembly comprising the vertical stack 15 of alternating insulative levels 18 and wordline levels 20. The opening 30 has been formed through the stack 15, and the materials 34, 36, 40 and 42 have been formed within such opening. The semiconductor channel material 42 is configured as the hollow tube 44 which extends vertically through the stack. The hollow tube 44 comprises the interior surface 43.

Figure 8:
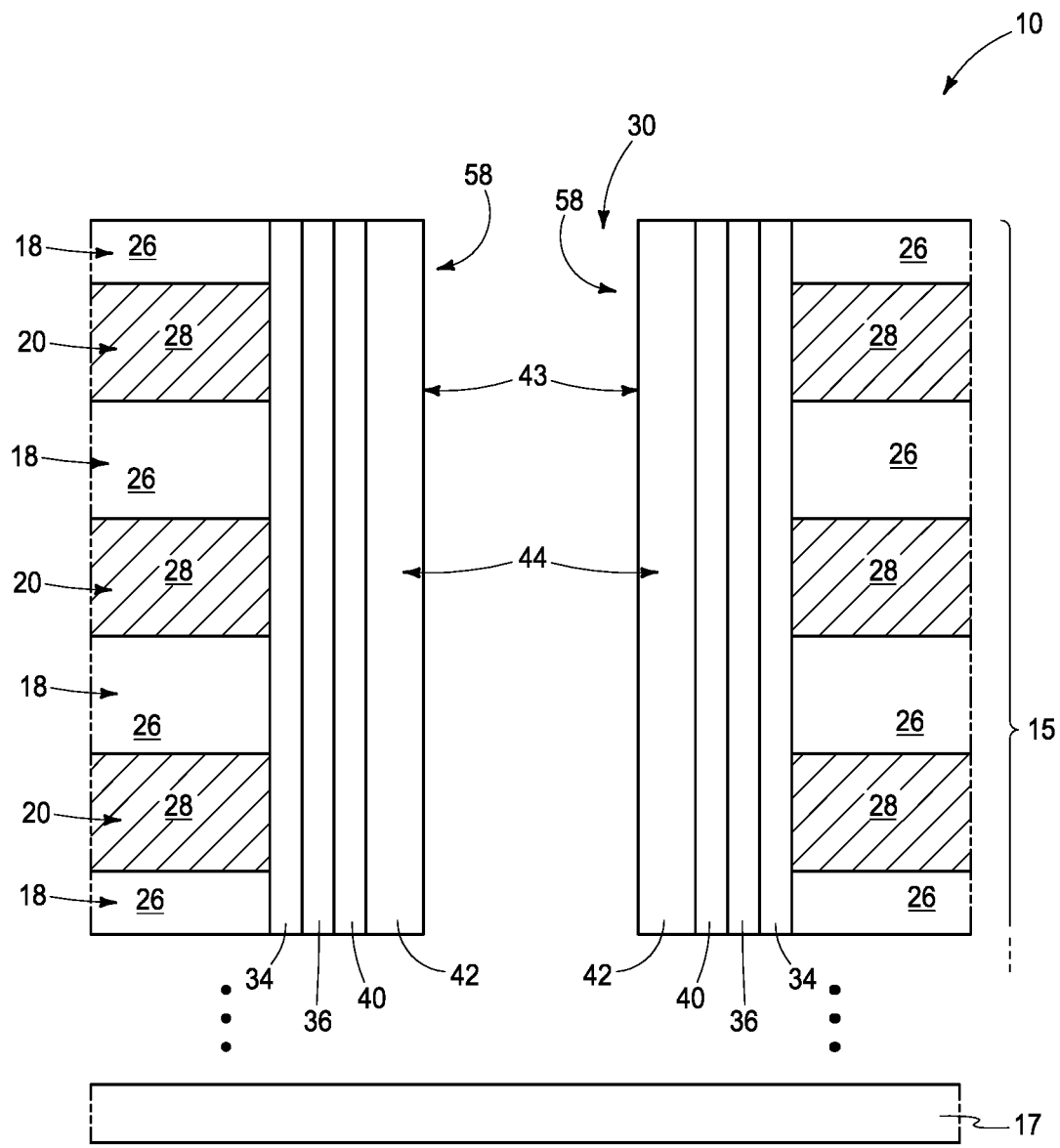

Referring to FIG. 8, nitrogen-containing material 58 is flowed into the opening 30 and utilized to disperse nitrogen along the interior surface 43 of the hollow tube 44, and/or into the semiconductor channel material 42. The nitrogen-containing material 58 may comprise any suitable material, and may be provided within the opening 30 utilizing any suitable methodology. For instance, in some embodiments the nitrogen-containing material 58 may comprise precursor suitable to form silicon nitride deposited along the interior surfaces 43 utilizing one or both of atomic layer deposition (ALD) and chemical vapor deposition (CVD). In some embodiments, the nitrogen-containing material 58 may comprise one or both of ammonia ($NH_3$) and hydrazine ($N_2H_2$) and may be utilized for rapid thermal nitridation (RTN). Such may be conducted at a temperature of from about 800° C. to about 1000° C., for a time of from about five seconds to about 60 seconds, under atmospheric pressure or any other suitable pressure. In some embodiments, the nitrogen-containing material 58 may comprise $N_2$ and may be utilized for plasma nitridation. The plasma nitridation may include a plasma that contacts the channel material 42, and may be conducted under conditions with no bias, a power of from about 500 watts (W) to about 3500 W, and a temperature of from about 200° C. to about 700° C. Alternatively, the plasma nitridation may be remote plasma nitridation (RPN) and may utilize plasma that does not contact the channel material 42. If plasma nitridation is utilized, one or both of argon and hydrogen may be included with the nitrogen in the plasma.

One or more of oxygen, fluorine and hydrogen may be provided within the opening 30 in addition to the nitrogen-containing material 58. In such embodiments, the oxygen, fluorine and/or hydrogen may be flowed into the opening 30 together with the nitrogen-containing material 58, or may be flowed into the opening 30 sequentially relative to the nitrogen-containing material 58.

Figure 9:
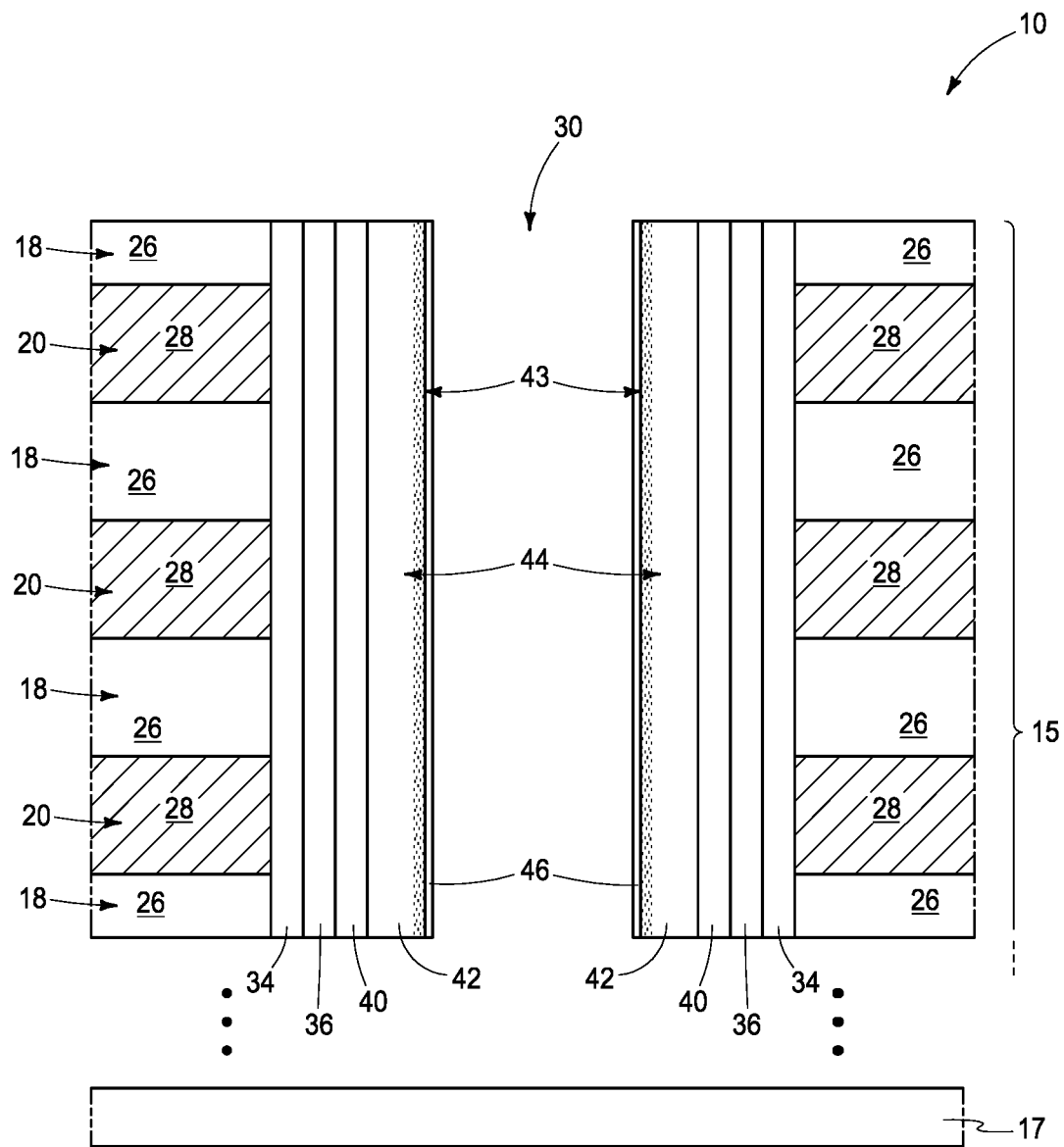

Referring to FIG. 9, construction 10 is shown at a processing stage following that of FIG. 8, and in accordance with an embodiment in which the nitrogen-containing material 58 forms the stoichiometric silicon nitride 46 along the interior surface 43 of the tube 44 of semiconductor channel material 42, and disperses nitrogen into the channel material 42 (as is diagrammatically indicated by stippling). In other embodiments, the nitrogen-containing material of FIG. 8 (material 58) may simply disperse nitrogen within channel material 42 without forming the stoichiometric silicon nitride 46 along the surface of material 42.

Figure 10:
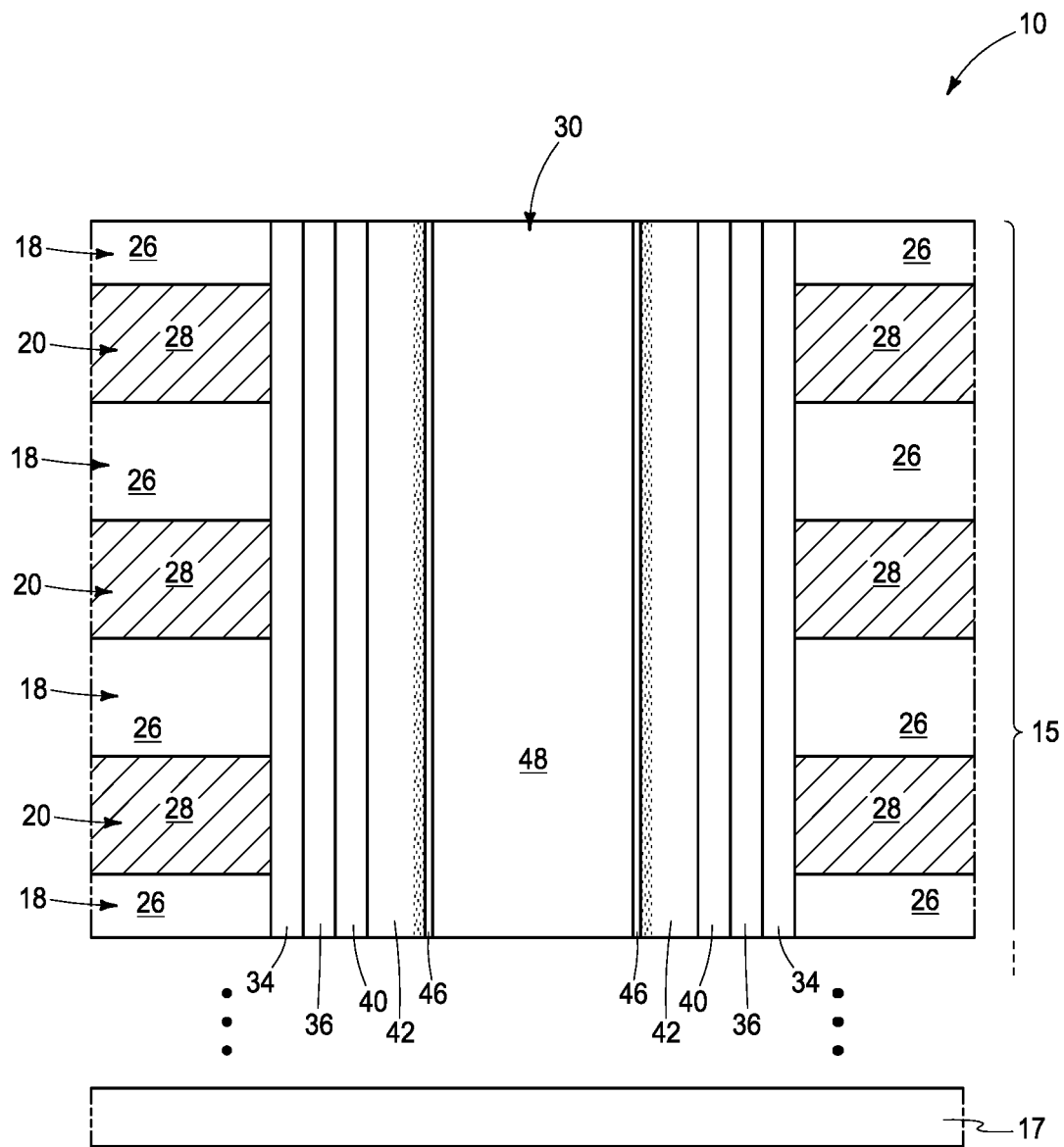

Referring to FIG. 10, the insulative material 48 is provided within 30, and such completes the configuration described above with reference to FIG. 1.

Figure 11:
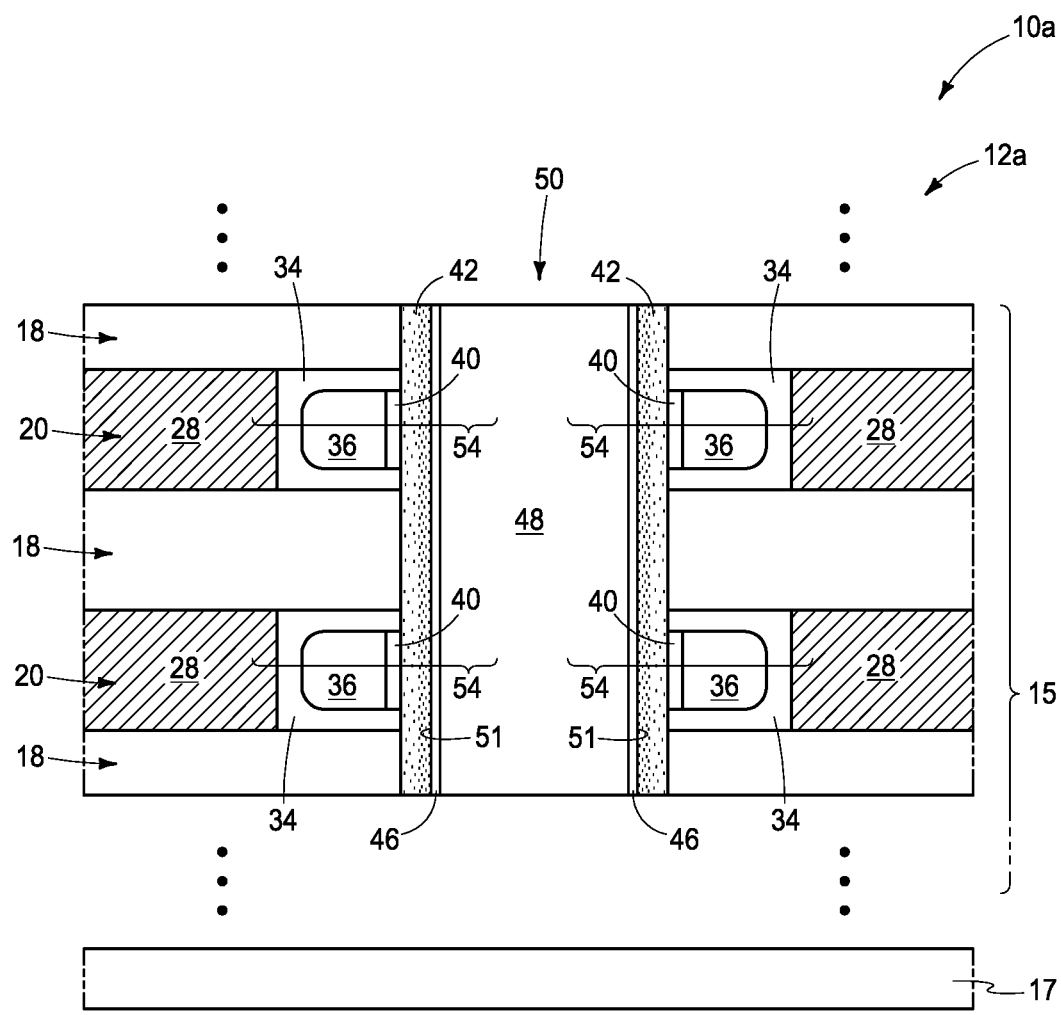
FIG. 11 is a diagrammatic cross-sectional side view of an example portion of another example NAND memory array.

FIGS. 1-10 illustrate an example NAND memory array. FIG. 11 shows a construction 10*a* illustrating another example NAND memory array 12*a*. The charge-storage material 36 of construction 10*a* is configured as floating gates. The tunneling material (i.e. gate dielectric material) 40 is provided between the charge-storage material 36 and the channel material 42, and the charge-blocking material 34 partially surrounds the charge-storage material 36 and is between the charge-storage material 36 and the wordline material 28.

Regardless of whether the NAND memory configuration of FIG. 1 is utilized, the NAND memory configuration of FIG. 11 is utilized, or a different NAND memory configuration is utilized, such may benefit from inclusion of nitrogen along an interior surface of the channel material 42 and/or dispersed into the channel material 42 in that such nitrogen can increase current (i.e., reduce resistivity) along the channel material 42. The increased current may enable improved read operations and/or other operations as compared to conventional NAND memory constructions lacking nitrogen along and/or within analogous channel material.

Figure 12:
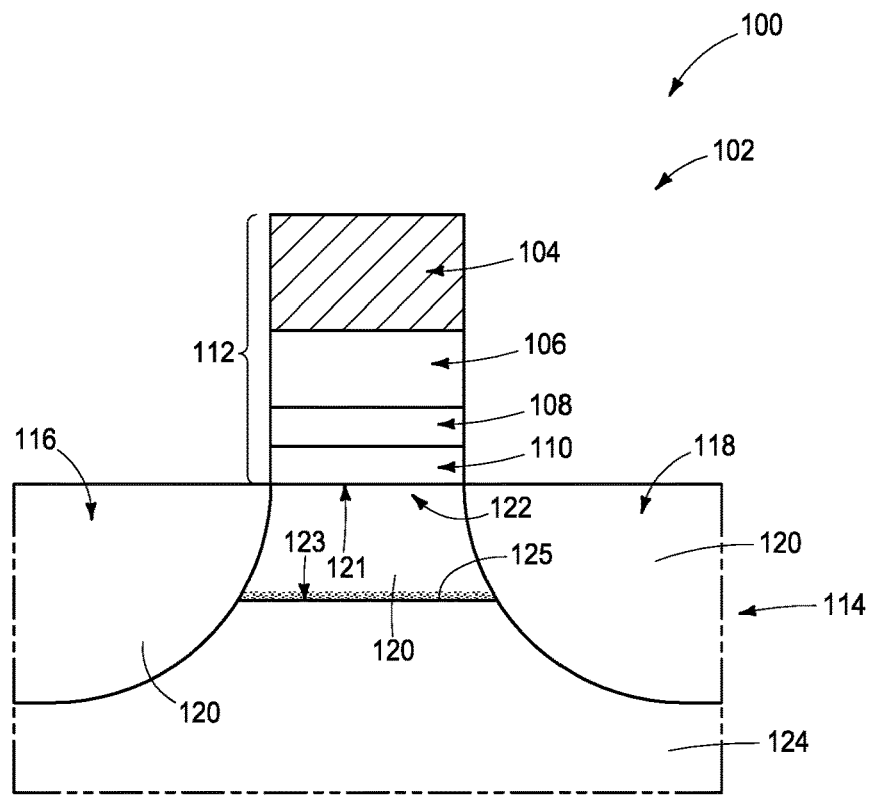
FIGS. 12 and 13 are diagrammatic cross-sectional side views of example flash transistors.

Nitrogen along and/or within channel material may be incorporated into flash transistor architecture in some embodiments. For instance, FIG. 12 shows a construction 100 comprising a flash transistor (or flash memory transistor) 102. The transistor 102 includes a control gate 104, a charge-storage material 108, charge-blocking material 106 between the gate 104 and the charge-storage material 108, and tunnel dielectric 110 beneath the charge-storage material 108. The control gate 104 may comprise any of the electrically conductive compositions described above relative to the wordline material 28 of FIG. 1; the charge-blocking material 106 may comprise any of the compositions described above relative to the charge-blocking material 34 of FIG. 1; the charge-storage material 108 may comprise any of the compositions described above relative to the charge-storage material 36 of FIG. 1; and the tunnel dielectric material 110 may comprise any of the compositions described above with reference to the tunnel dielectric material 40 of FIG. 1.

The materials 104, 106, 108 and 110 together form a stack 112, and such stack is supported by a substrate 114. The substrate 114 includes a pair of source/drain regions 116 and 118 that extend into a semiconductor material 120. The semiconductor material 120 may comprise any of the compositions described above relative to the semiconductor channel material 42 of FIG. 1.

A channel region 122 is within the semiconductor material 120 and between the source/drain regions 116 and 118. The channel region 122 is directly beneath the stack 112 in the illustrated embodiment.

The semiconductor material 120 is supported by a nitrogen-containing material 124. Such nitrogen-containing material may comprise, consist essentially of, or consist of silicon nitride in some embodiments. An interface 125 is between the nitrogen-containing material 124 and the semiconductor material 120 directly along the channel region 122. In operation, charge flows parallel to such interface when the charge flows through the channel region 122 and between the source/drain regions 116 and 118. The nitrogen along interface 125 may improve conductivity within the channel region 122. Further, in some embodiments nitrogen may disperse from the nitrogen-containing material 124 into the channel region 122 (as is diagrammatically indicated with stippling), which may further improve conductivity within the channel region.

In some embodiments, the nitrogen-containing material 124 may be stoichiometric silicon nitride. The channel region 122 has a first side 121 directly against a dielectric region comprising the dielectric material 110, and has a second side 123 in opposing relation to the first side 121. The second side 123 is along the interface 125. In the shown embodiment, a region of the nitrogen containing material (e.g., stoichiometric silicon nitride) 124 extends upwardly to be laterally between the source/drain regions 116 and 118. Generally, it may be desired that the nitrogen containing material (e.g., stoichiometric silicon nitride) extends no more than about halfway up the source/drain regions 116 and 118 as the nitrogen containing material may be insulative and the conductivity of the channel region may be impaired if the vertical thickness of the channel region is overly restricted by an insulative nitrogen-containing material 124.

Figure 13:
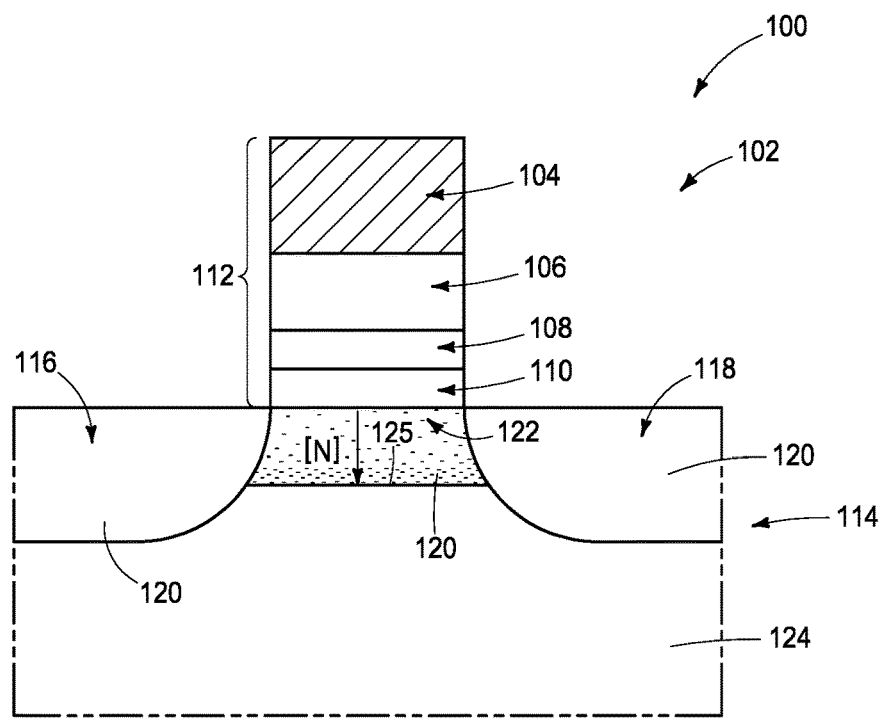

The nitrogen within the channel region 122 may be primarily along the interface 125, or may extend a substantial distance into the channel region. If the nitrogen extends a substantial distance into the channel region, a gradient of nitrogen concentration may be established analogously to the gradients described above with reference to FIGS. 3, 5 and 6. For instance, FIG. 13 shows construction 100 in an embodiment in which a gradient of nitrogen concentration [N] extends downwardly toward the interface 125 (with such gradient being diagrammatically illustrated with an arrow and with stippling).

The structures discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include device which includes a gate spaced from semiconductor channel material by a dielectric region, and nitrogen-containing material directly against the semiconductor channel material and on an opposing side of the semiconductor channel material from the dielectric region.

Some embodiments include a device which includes a gate spaced from semiconductor channel material by a dielectric region, and nitrogen within at least some of the semiconductor channel material.

Some embodiments include a memory array (e.g., a NAND memory array) which comprises a vertical stack of alternating insulative levels and wordline levels. Channel material extends vertically through the stack. Charge-storage material is between the channel material and the wordline levels. Dielectric material is between the channel material and the charge-storage material. Nitrogen is within the channel material.

Some embodiments include a memory array, comprising a vertical stack of alternating insulative levels and wordline levels. Channel material extends vertically through the stack. Charge-storage material is between the channel material and the wordline levels. Dielectric material is between the channel material and the charge-storage material. Nitrogen-containing material is directly against the channel material and on an opposing side of the channel material from the dielectric material.

Some embodiments include a method of forming a memory array (e.g., a NAND memory array). An assembly is formed to comprise a vertical stack of alternating insulative levels and wordline levels, and to comprise a hollow tube of semiconductor channel material extending vertically through the stack. Nitrogen is dispersed along an interior surface of the hollow tube and into the semiconductor channel material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory array, comprising:
   forming an assembly comprising a vertical stack of alternating insulative levels and wordline levels, and comprising a hollow tube of semiconductor channel material extending vertically through the stack the hollow tube of semiconductor channel material has a wall thickness within a range of from about 50 Å to about 150 Å; and
   dispersing nitrogen along an interior surface of the hollow tube and into the semiconductor channel material, wherein the dispersing of the nitrogen into the semiconductor channel material comprises:
   formation of a layer of stoichiometric silicon nitride extending vertically along the interior surface of the hollow tube of the semiconductor channel material the layer of stoichiometric silicon nitride having a wall thickness within a range of from about 5 Å to about 30 Å; and
   dispersing the nitrogen into the semiconductor channel material along an interface where the semiconductor channel material joins said layer of stoichiometric silicon nitride.

2. The method of claim 1 further comprising dispersing one or more of oxygen, fluorine and hydrogen into the semiconductor channel material with the nitrogen.

3. The method of claim 1 wherein the formation of the layer of stoichiometric silicon nitride comprises utilization of one or both of atomic layer deposition and chemical vapor deposition.

4. The method of claim 1 wherein the formation of the layer of stoichiometric silicon nitride comprises utilization of rapid thermal nitridation (RTN).

5. The method of claim 1 wherein the formation of the layer of stoichiometric silicon nitride comprises utilization of plasma nitridation.

6. A method of forming a device, comprising:
   forming a gate spaced from a conductively doped polycrystalline silicon material by a dielectric region;
   forming a silicon nitride material directly against the conductively doped polycrystalline silicon material and on an opposing side of the conductively doped polycrystalline silicon material from the dielectric region; and wherein:
   the conductively doped polycrystalline silicon material joins to the silicon nitride along an interface;
   a volume of the conductively doped polycrystalline silicon material comprises nitrogen to a concentration within a range of from about 0.1 atomic percent to about 5 atomic percent; said volume of the conductively doped polycrystalline silicon material being within a distance of no greater than about 10 Å from said interface; and
   said volume of the conductively doped polycrystalline silicon material further comprises fluorine.

7. The method of claim 6 wherein the device is a transistor having the conductively doped polycrystalline silicon material extending between a pair of source/drain regions.

8. The method of claim 6 wherein the device is a NAND memory cell having charge-storage material on an opposing side of the dielectric region from the conductively doped polycrystalline silicon material.

9. A method of forming a device, comprising:
   forming a stack of alternative insulative levels and conductive levels, the insulative levels comprising an insulative material;

forming a gate within a first conductive level comprised by the stack and spaced from a semiconductor channel material by a dielectric region, the channel material being in direct contact with the dielectric region along an interface;

forming a volume of the semiconductor channel material comprising nitrogen to a concentration within a range of from about 0.1 atomic percent to about 5 atomic percent; said volume being within a range of from about 1 volume percent of the semiconductor channel material to about an entirety of the semiconductor channel material, the semiconductor channel material having a higher nitrogen concentration along a surface opposing the interface than a concentration of nitrogen along the interface; and forming said volume of the semiconductor channel material to additionally comprise fluorine.

10. The method of claim 9 wherein a concentration of the nitrogen within the channel material changes along a lateral direction and is substantially constant along a vertical direction.

11. The method of claim 9 wherein the channel material is configured as a tube having an exterior surface along the stack and an interior surface in opposing relation to the exterior surface; and comprising a stoichiometric silicon nitride material directly against the interior surface of the tube.

12. The method of claim 9 wherein the channel material comprises silicon.

* * * * *